United States Patent [19]

Miyabayashi

[11] Patent Number: 4,777,078
[45] Date of Patent: Oct. 11, 1988

[54] PROCESS FOR FORMING COPPER COATING HAVING EXCELLENT MECHANICAL PROPERTIES, AND PRINTED-WIRING BOARD WITH CONDUCTOR PATTERN FORMED OF SUCH COPPER COATING

[75] Inventor: Takeshi Miyabayashi, Nagoya, Japan

[73] Assignee: Brother Kogyo Kabushiki Kaisha, Aichi, Japan

[21] Appl. No.: 23,632

[22] Filed: Mar. 9, 1987

[30] Foreign Application Priority Data

Mar. 12, 1986 [JP] Japan .................................. 61-54200

[51] Int. Cl.[4] .......................... B32B 3/00; B05D 3/06; H01K 5/00
[52] U.S. Cl. .................................... 428/211; 428/131; 428/137; 428/209; 428/901; 427/43.1; 427/54.1; 427/305; 174/68.5
[58] Field of Search ............... 428/131, 137, 209, 211, 428/901; 524/423; 427/43.1, 54.1, 305; 174/68.5

[56] References Cited

U.S. PATENT DOCUMENTS 4,082,557 4/1978 Pizzio .
4,568,570 2/1986 Giesecke .
4,666,744 5/1987 DeLuca et al. ..................... 427/304

Primary Examiner—John E. Kittle
Assistant Examiner—P. J. Ryan
Attorney, Agent, or Firm—Parkhurst, Oliff & Berridge

[57] ABSTRACT

A process of forming on a substrate a copper coating which has excellent mechanical properties, comprising depositing copper on the substrate by chemical plating, and forming at least one silver-rich layer during the deposition of copper, each silver-rich layer has a higher content of silver than the other portion of the copper coating. Also disclosed is a process of producing a printed-wiring board by forming such a copper coating.

15 Claims, 5 Drawing Sheets

PROCESS FOR FORMING COPPER COATING HAVING EXCELLENT MECHANICAL PROPERTIES, AND PRINTED-WIRING BOARD WITH CONDUCTOR PATTERN FORMED OF SUCH COPPER COATING

BACKGROUND OF THE INVENTION

1. Field of the Invention

The present invention relates generally to a process for forming a copper coating by chemical or electroless plating, and more particularly a chemical plating process suitable for forming a copper coating having excellent mechanical properties, and to a printed-wiring board with conductive wiring patterns formed of such a copper coating.

2. Discussion of the Prior Art

A copper coating is formed on a substrate by a chemical plating process wherein the substrate is immersed in a plating bath containing copper salts, reducing agents and buffer agents, and a copper material in the bath is deposited on the surfaces of the substrate due to concurrent or parallel oxidazation and reduction. The chemical plating process is useful for forming copper coatings on various electrically insulating materials, and is therefore widely practiced for various industrial applications. However, this process is disadvantageous in that the copper coatings obtained are not completely satisfactory in mechanical properties such as tensile strength and elongation.

For example, the chemical plating technique is widely utilized to form conductive wiring patterns of copper on an electrically insulating substrate, for fabricating printed-wiring boards. However, it is recognized that the copper coatings thus formed on the substrate tend to suffer from cracking due to a difference in thermal expansion coefficient between the substrate and the coating layer, and other factors. Thus, it is difficult to produce highly reliable printed-wiring boards by solely relying on the chemical plating technique. Cracking of the copper coating on the printed-wiring boards is serious, particularly where the wiring patterns of copper provided on the opposite major surfaces of the substrate are electrically connected to each other by a copper layer formed on the inner surfaces of through-holes formed through the substrate. More specifically, the copper coating is subject to heavy cracking near the openings of the through-holes, which may easily cause electrical discontinuity of the wiring patterns.

In light of the above drawbacks, it has been a conventional practice to first form a copper coating with a thickness of 0.5 to several microns by chemical plating, and then perform an electroplating process wherein the formed copper coating is connected as a cathode, and a copper material in an electrolyte solution is electrodeposited on the previously formed copper coating, whereby the eventually obtained coating is improved in its mechanical properties.

The conventional practice indicated above requires suitable electroplating equipment, and a complicated procedure to obtain a desired copper coating, which inevitably leads to increased cost of manufacture. In this connection, it is noted that one of the important advantages of a chemical plating process lies in the absence of any electrical equipment. If it is possible to form a mechanically excellent copper coating solely by the chemical or electroless plating process, the conventional need of an additional electroplating step and the electrical equipment therefor can be eliminated, and the economical advantage of the chemical plating can be enjoyed. Further, improvements in the mechanical properties of such copper coatings are desirable even in the fields of technology in which the copper coatings produced solely by the conventional electroless plating technique are almost satisfactory.

SUMMARY OF THE INVENTION

It is therefore an object of the present invention to provide a process of forming a copper coating by chemical plating, which provides improved mechanical properties of the copper coating.

Another object of the invention is to provide a process of producing a printed-wiring board using a copper coating which is formed by chemical plating and which has improved mechanical properties.

It is a further object of the invention to provide a printed-wiring board which has a mechanically excellent wiring pattern of copper formed by chemical plating.

According to the present invention, there is provided a process of forming on a substrate a copper coating which has excellent mechanical properties, comprising the steps of depositing copper on the substrate by chemical plating, and forming at least one silver-rich layer during the deposition of copper. Each silver-rich layer has a higher content of silver than the other portion of the copper coating.

The silver-rich layer or layers formed in the thus obtained copper coating contribute to improving the tensile strength, elongation and other mechanical properties of the coating. In other words, the presence of the silver-rich layer or layers enhances the reliability of the copper coating formed by chemical plating, and consequently improves the quality of the plated articles or products.

Although the copper coating having only one silver-rich layer is more excellent in mechanical properties than a copper coating prepared by a conventional chemical plating process, it is desirable that the coating has a plurality of such silver-rich layers, for further improvement in the mechanical properties.

The silver-rich layer or layers may be formed by using a suitable form of silver, preferably by adding a silver compound to a plating bath while the substrate is immersed in the bath.

According to one advantageous feature of the present invention, the steps of depositing copper and forming at least one silver-rich layer comprise: intermittently adding 0.001–10 g of sodium iodide and 0.001–10 g of a chelate compound of Ag (silver) and EDTA (ethylenediaminetetraacetic acid), to a plating bath which contains 1–50 g of $CuSO_4.5H_2O$ (cupric sulfate pentahydrate), 5–200 g of $EDTA.4Na.2H_2O$ (ethylenediaminetetraacetic acid tetrasodium salt dihydrate), 1–30 ml of formalin (solution of about 37% by weight of formaldehyde gas in water), 1–100 mg of $\alpha,\alpha'$-dipyridyl, and 1–100 g of polyethylene glycol, each per 1 l of water; maintaining a temperature of the bath within a range of 60°–85° C., a pH value of the bath within a range of 11.0–13.0, and a specific gravity of the bath within a range of 1–18 in Baume scale; and continuously stirring the bath by blowing air into the bath. The contents of the sodium iodide and the chelate compound of Ag and EDTA to be added to the bath are starting or initial concentrations per one liter of water. In this case, the deposition of copper occurs at a rate of 1–5 microns per hour, that is, the thickness of the copper coating increases at a rate of 1–5 microns per hour.

In one preferred form of the above feature of the invention, the step of intermittently adding the sodium iodide and Ag EDTA comprises at least one adding cycle each of which consists of a plurality of intermittent additions which are effected at an interval of a first time span, and an interruption for a second time span following completion of the intermittent additions. The second time span is longer than the first time span. Namely, the addition of the sodium iodide and chelate compound (Ag.EDTA) is interrupted for a period longer than the interval between the successive intermittent additions.

The plating bath may be wholly replaced by a fresh solution after a given number or batch of articles are plated. Alternatively, a certain portion of the bath may be continuously replaced by an appropriate continuous flow of a fresh mass. In the latter case, the plating may be accomplished in a continuous manner.

According to another aspect of the invention, there is provided a process of producing a printed-wiring board having an electrically insulating substrate, and a conductor pattern formed on the substrate, the conductor pattern consisting of a copper coating which is formed by depositing copper on selected areas of the substrate by chemical plating such that the selected areas define the conductor pattern. The instant process comprises a step of forming at least one silver-rich layer during the deposition of copper. Each silver-rich layer has a higher content of silver than the other portion of the copper coating.

The conductor pattern formed of the copper coating prepared according to the above process of the invention is highly resistant to cracking, and is consequently improved in the reliability of electrical continuity, since the presence of the silver-rich layer or layers in the coating improve the mechanical properties of the coating. Thus, the instant process permits the production of an improved printed-wiring board, without using an electroplating technique which is conventionally required to reinforce some parts of the chemically plated copper coating that are otherwise likely to crack. The elimination of an electroplating step is conductive to lowering the cost of manufacture of the printed-wiring board.

The process of producing a printed-wiring board indicated above is referred to as "additive" method in which the copper coating is formed on only selected areas of the substrate, so that the selected areas define the desired wiring pattern of copper. Generally, the additive method is difficult to be practiced to obtain a copper coating having sufficiently excellent mechanical properties, as compared with so-called "substractive" method in which the desired wiring pattern is formed by removing unnecessary portions of the copper coating which has been provided over the entire surface of the substrate. In this sense, the instant process which falls within the category of the additive method is industrially significant.

Nevertheless, the concept of the present invention is applicable to the subtractive method, since the silver-rich layer or layers give the wiring pattern improved mechanical properties. In this case, the copper coating is formed over the entire area of at least one of opposite major surfaces of the substrate, by depositing copper by chemical plating. Then, selected portions of the copper coating are removed so that unremoved portions of the coating define the conductor pattern of copper.

The process of the invention for producing a printed-wiring pattern, whether practiced as the additive or subtrative method, is particularly advantageous, where the printed-wiring board has conductive copper patterns on both major surfaces of the substrate, and the conductive or conductor patterns are electrically connected to each other via through-holes formed through the substrate. That is, the copper coating according to the invention may be provided on the inner surface defining these through-holes, so that the copper coating electrically connects the two wiring patterns of copper on the opposite surfaces of the substrate. Conventionally, the copper coating on the surface of the through-holes is formed by combined electroless and electroplating techniques for assuring satisfactory reliability in the electrical continuity of the wiring patterns. Further, the additive method which is theoretically superior to the substractive method, has not been practiced in many cases, because of the difficulty in providing satisfactory reliability in the electrical continuity at the copper coatings on the surfaces of the through-holes. In this respect, too, the present invention is significant, since it has widened the application range of the additive method.

BRIEF DESCRIPTION OF THE DRAWINGS

The above and other objects, features and advantages of the present invention will become more apparent by reading the following description of preferred examples of the present invention, when considered in connection with the accompanying drawings, in which.

DETAILED DESCRIPTION OF THE PREFERRED EMBODIMENT

Example 1

Figure 1:
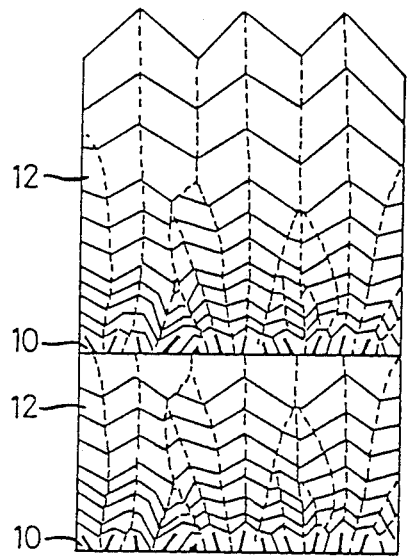
FIG. 1 is an illustration of a microstructure of a copper coating formed according to one embodiment of the invention.

Many electrically insulating specimen substrates were chemically plated under the following conditions, to obtain a 25-micron thick copper coating on each specimen substrate.

The plating bath used contains the following components in amounts indicated per 1 liter of water:

| | |
|---|---|
| $CuSO_4.5H_2O$ | 7 g |
| $EDTA.4Na.2H_2O$ | 30 g |
| 37 wt. % solution of HCHO | 3 ml |
| $\alpha, \alpha'$-dipyridyl | 10 mg |
| polyethylene glycol | 10 g |
| sodium iodide | 10 mg |
| chelate compound of Ag and EDTA | 50 mg |

During the plating process, the bath was maintained at a temperature between 69° C. and 70° C., and the pH value of the bath was held at 12.3 by automatically adding sodium hydroxide (NaOH). Further, the specific gravity was maintained within a range between 1 and 18 in Baumé scale, and the bath was continuously stirred by blowing air into the bath.

The compositions of the bath and the plating conditions were formulated so that the thickness of the copper coating deposited increases at a rate of 3 microns per hour.

The sodium iodide and Ag.EDTA were introduced to the bath intermittently during the plating process. More specifically, these components were added five times at an interval of 20 minutes, or every twenty minutes. Each of the five additions was made in the proportions indicated above. Namely, the indicated proportions of sodium iodide and Ag EDTA are starting or initial concentrations upon each addition. After completion of the fifth addition, the plating was continued for 60 minutes without addition of sodium iodide and Ag EDTA. Then, these components were again added to the bath five times at the same time interval, i.e., every 20 minutes. The plating process was further continued until the copper coating is given the specified thickness of 25 microns. In the present specific example, each of the two adding cycles of sodium iodide and Ag EDTA consists of five intermittent additions at the interval of 20 minutes, and one interruption for 60 minutes. With these two adding cycles, the formed copper coating was given two silver-rich layers having a silver content higher than the other portion of the coating.

The components of the plating bath other than sodium iodide and Ag.EDTA were added as needed, in suitable amounts so as to maintain their contents indicated above. The stirring of the bath was achieved by blowing air, for an additional purpose of increasing an amount of oxygen dissolved in the bath solution.

The tensile strength, elongation, and silver content of the copper coating thus formed on the specimen substrates were measured. The measurements are as follows:

Tensile strength: 40–50 kg/mm²
Elongation: 10%
Silver content: 800 ppm

The tensile strength of 40–50 kg/mm² of the instant copper coating is about two times as high as that of a copper coating formed in a conventional chemical plating process. The elongation of 10% of the instant copper coating is about two to three times as high as that of the conventional copper coating. These results indicate that the present process provides considerable increases in the mechanical properties of the copper coating.

The obtained copper coating was cut in a transverse cross sectional plane, and the cut surface was observed by a microscope. The microscopic structure was schematically illustrated in FIG. 1. The illustration shows that each silver-rich layer 10 which was formed by eutectoid reaction of silver and copper is followed by a crystallized copper layer 12. It will be seen that the grain size of the crystallized copper layer 12 is comparatively small near the silver-rich layer 10. As the deposition of copper proceeds in a direction away from the silver-rich layer 10, the grain size of the copper layer 12 increases until the next silver-rich layer 10 is formed. Thus, each time the silver-rich layer 10 is formed, the precipitation of copper is initialized, and the average grain size of the copper coating as a whole is reduced. This reduction in the average grain size is considered to result in the improved mechanical properties of the copper coating formed according to the present invention.

Example 2

Figure 2A:
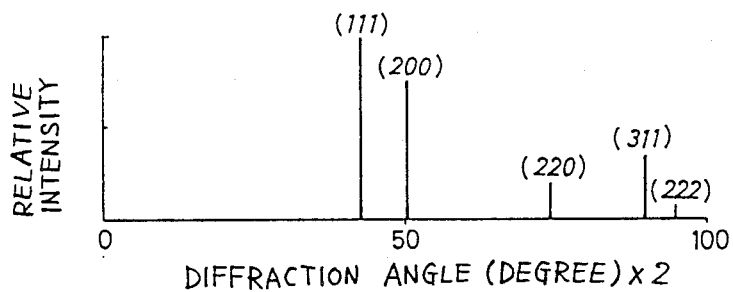
FIGS. 2(a) and 2(b) are graphical representations of x-ray diffraction intensities measured on a comparative copper coating prepared according to a conventional process.
Figure 2B:
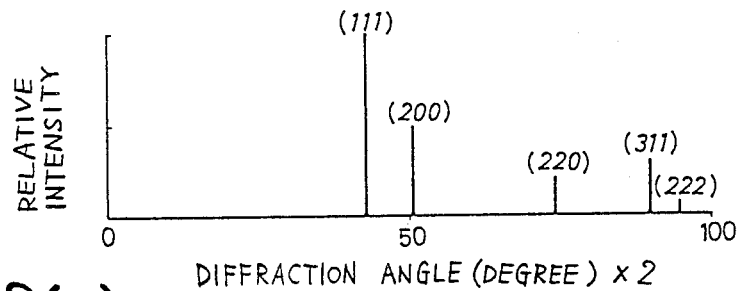
Figure 2C:
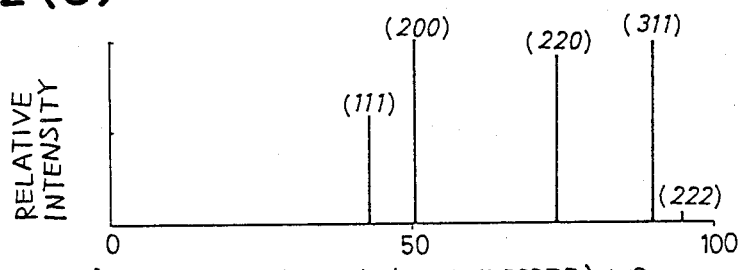
FIGS. 2(c) and 2(d) are graphical representations of x-ray diffraction intensities measured on the copper coating according to the present invention.
Figure 2D:
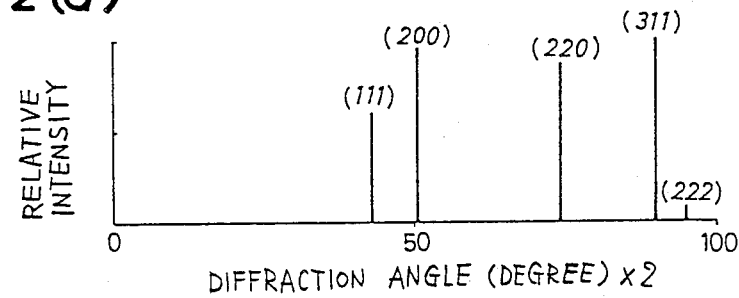

A printed-wiring board was prepared in a known additive method, by forming conductor patterns of copper in a chemical plating process similar to that in Example 1. A comparative sample was prepared also in the additive method, but according to a conventional chemical plating process. The copper coatings of the obtained printed-wiring boards were subjected to an x-ray diffraction analysis, to measure the x-ray diffraction intensities. The measurements were made on faces (111), (200), (220), (222) and (311) of the crystalline structure of the coatings. The test results of the comparative sample are indicated in FIGS. 2(a) and 2(b), and those of the instant board are indicated in FIGS. 2(c) and 2(d). FIGS. 2(a) and 2(c) show the intensities measured before the copper coatings were post-cured, and FIGS. 2(b) and 2(d) show the intensities after the post-curing treatment of the coatings. As is apparent from the figures, the x-ray diffraction intensity of the copper coating is comparatively higher on the face (111) in the comparative sample, while the intensity of the instant coating of the invention is comparatively higher on the faces (200), (220) and (311) than on the face (111).

Further, the half widths of the x-ray diffraction intensities on the face (200) were measured, in order to make a comparison of the grain sizes between the copper coatings of the instant and comparative boards. The half width value of the instant board was 0.25°, which is less than half of 0.5° measured on the comparative sample.

The copper coatings of the boards according to the instant process and the conventional process were further subjected to an x-ray diffraction analysis, to measure the content of cuprous oxide ($CuO_2$). For comparison, a measurement was also made on a copper coating which was formed by electroplating using copper pyrophosphate. The measurements are as follows:

| | Count/sec. |
|---|---|
| Instant coating | 0 |
| Conventional coating by chemical plating | 19–45 |
| Conventional coating by electroplating | 0 |

The observation and the test results indicated above in connection with Examples 1 and 2 give the following presumption.

The presence of silver not only contributes to reducing the grain size of the copper crystals as previously described, but also serves to change the form of oxidizing reaction of formalin, so as to effectively achieve preferential crystal growth of copper.

While sodium iodide is added as a stabilizing agent, the iodine ions have an extremely high tendency to adhere to the surface of the copper coating being formed as an anion, and functions as an inhibitor to restrain an oxidizing reaction of formalin, thus affecting the orientation of the copper crystals. Furthermore, the sodium iodide which inhibits the oxidizing reaction of formalin, enables the EDTA as a complexing agent to serve as a copper reducing agent. An experiment showed an oxidizing reaction of the EDTA. Thus, it seems that the reduction of the copper ions by substances other than the formalin will influence the crystallization of the copper, and contribute to enhancing the mechanical properties of the copper coating obtained.

The x-ray diffraction analysis revealed that the copper coating according to the present invention contains no cuprous oxide ($Cu_2O$), like the copper coating formed by the electroless plating, while the content of the cuprous oxide in the copper coating according to the conventional chemical plating process is considerably high. This fact also appears to contribute to improving the elongation property of the instant copper coating.

Example 3

Printed-wiring boards having through-holes and wiring patterns on its opposite surfaces were prepared according to the invention. These boards were subjected to a thermal shock test.

Described in more detail, some of the prepared boards employ a substrate (FR-3 according to the NEMA Standards) which is a paper impregnated with an epoxy resin, and the other boards employ a substrate (FR-2) which is a paper impregnated with a phenol resin. Holes were formed through the substrates, wiring patterns were formed in an additive method, according to the instant chemical plating process under the same conditions as in Example 1. Comparative samples were prepared in an additive method according to a conventional chemical plating process.

The obtained specimens were subjected to a thermal shock test in air, by repeating a heating-cooling cycle in which the specimens were held alternately at −65° C. and +125° C., each for 30 minutes. During the thermal shock test, a variation in the electrical resistance of the copper coating of the specimens was measured. This variation represents a magnitude of cracking of the coating, since the electrical resistance of the coating increases with an increase in the magnitude of cracking. The measurements of the electrical resistance variation are shown in FIG. 3.

Figure 3:
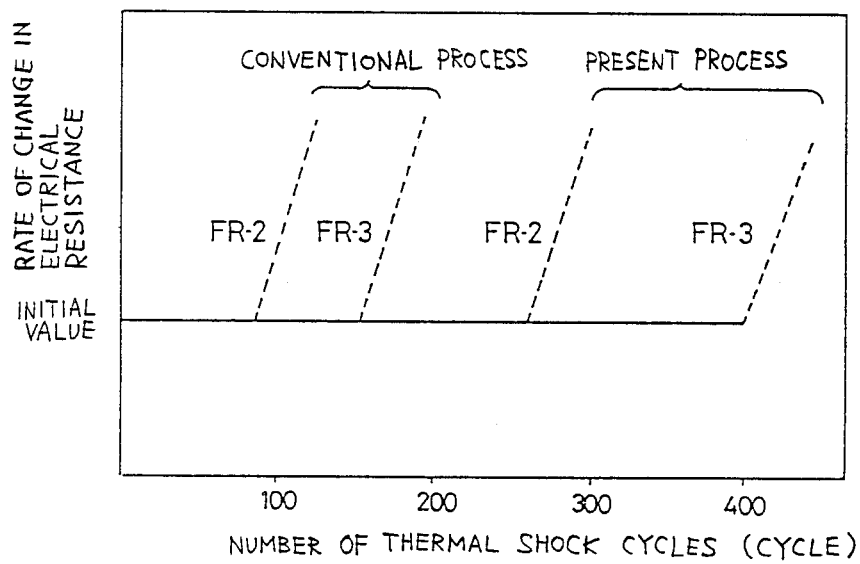
FIG. 3 is a graph showing the thermal shock resistance of the instant copper coating obtained in a thermal shock test, as compared with that of the comparative sample.

The graph in FIG. 3 shows that the thermal shock resistance of the copper coating (wiring patterns) of the printed-wiring boards according to the present invention is two to three times higher than that of the copper coating of the comparative samples. Thus, the instant copper coating exhibits improved durability in actual use. The printed-wiring boards fabricated by a conventional chemical plating process tend to use a substrate FR-4 (glass fiber sheet impregnated with an epoxy resin), though the substrate FR-4 is more expensive than the substrates FR-2 and FR-3. The substrates FR-2 and FR-3 have not be widely used for chemical plating applications, because they have a higher coefficient of thermal expansion than the substrate FR-4. In this context, it is noted that the present invention has made it possible to use the comparatively inexpensive substrates FR-2 and FR-3 for producing practically satisfactory printed-wiring boards in a chemical or electroless plating process.

Further, the specimens (according to the present and conventional processes) using the substrates FR-3 were subjected to a thermal shock test in a bath of water, by repeating a thermal shock cycle wherein the substrates were held at −65° C. and +100° C. alternately, each for 15 minutes. The amount of hydrogen absorbed or occluded in the copper coating was measured. The test result is illustrated in FIG. 4.

Figure 4:
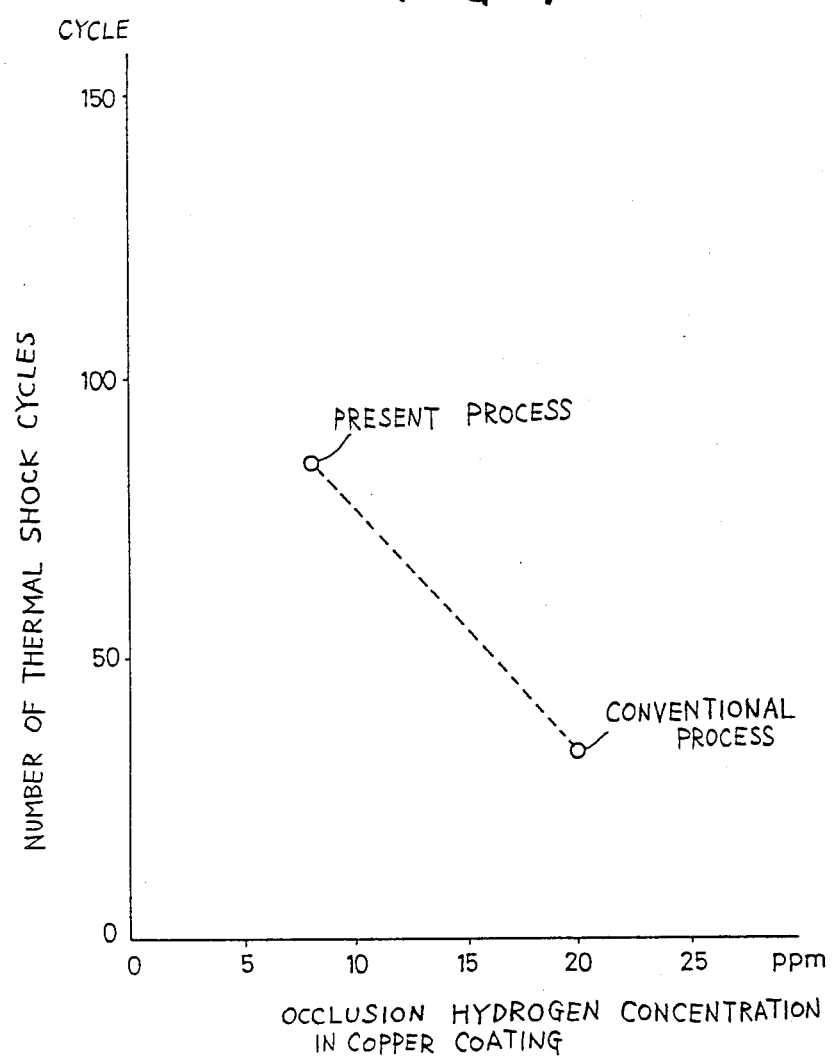
FIG. 4 is a graph illustrating a relation between the number of thermal shock cycles and the amount of hydrogen absorbed or occluded in the instant copper coating, as compared with that of the comparative sample.

The graph of FIG. 4 reveals that the copper coating according to the invention contains less than 10 ppm of hydrogen, which is less than half of about 20 ppm contained in the comparative sample. Furthermore, the thermal shock resistance of the instant copper coating is more than two times as high as that of the conventional coating. It has been a general recognition that the mechanical properties of a copper coating are improved with a decreasing content of hydrogen.

Example 4

Various copper coatings were prepared in the same manner as in Example 1, with the exception of changing the content of the chelate compound of Ag and EDTA to various values. The amount of sodium iodide was changed according to the content of the chelate compound. The contents of the other components of the plating bath were the same as in Example 1. The average concentration of silver (including the silver contained in the copper layers 12 of FIG. 1) and the tensile strength of the prepared specimens were measured. The same specimens were subjected to a thermal shock test. The relation between the silver concentration and the tensile strength, and the relation between between the silver concentration and the thermal shock resistance, are shown in FIGS. 5 and 6, respectively.

Figure 5:
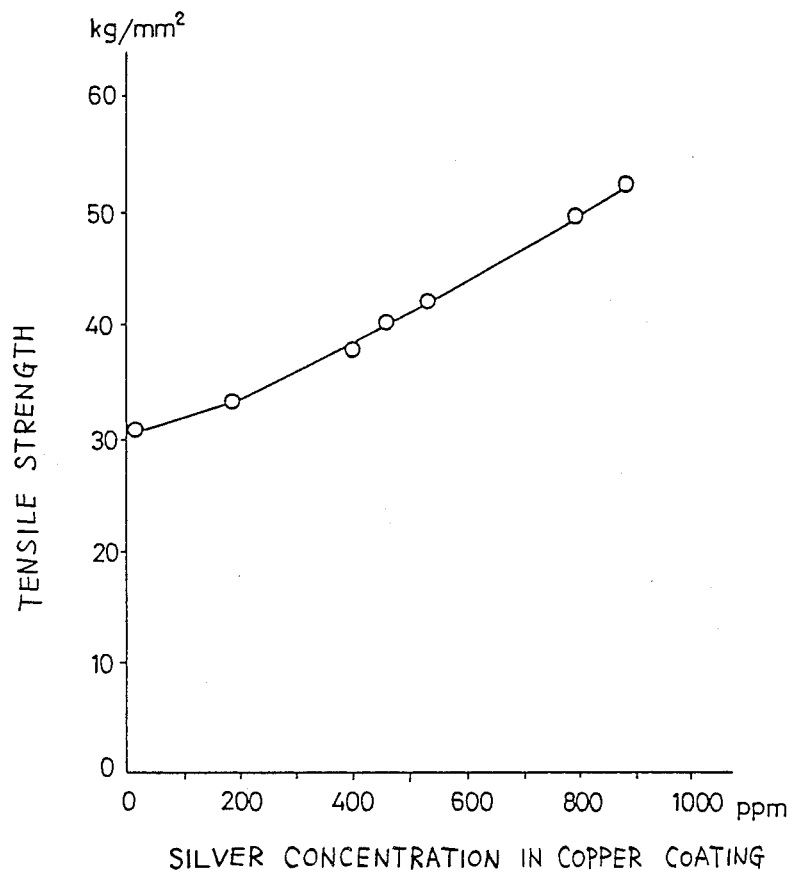
FIG. 5 is a graph illustrating a relation between the silver concentration and the the tensile strength of the instant copper coating.

FIG. 5 indicates that the tensile strength of the copper coating increases with an increase in the average silver concentration. More specifically, the tensile strength exceeds 40 kg/mm$^2$ and 50 kg/mm$^2$ when the silver concentration exceeds 500 ppm and 800 ppm, respectively.

Figure 6:
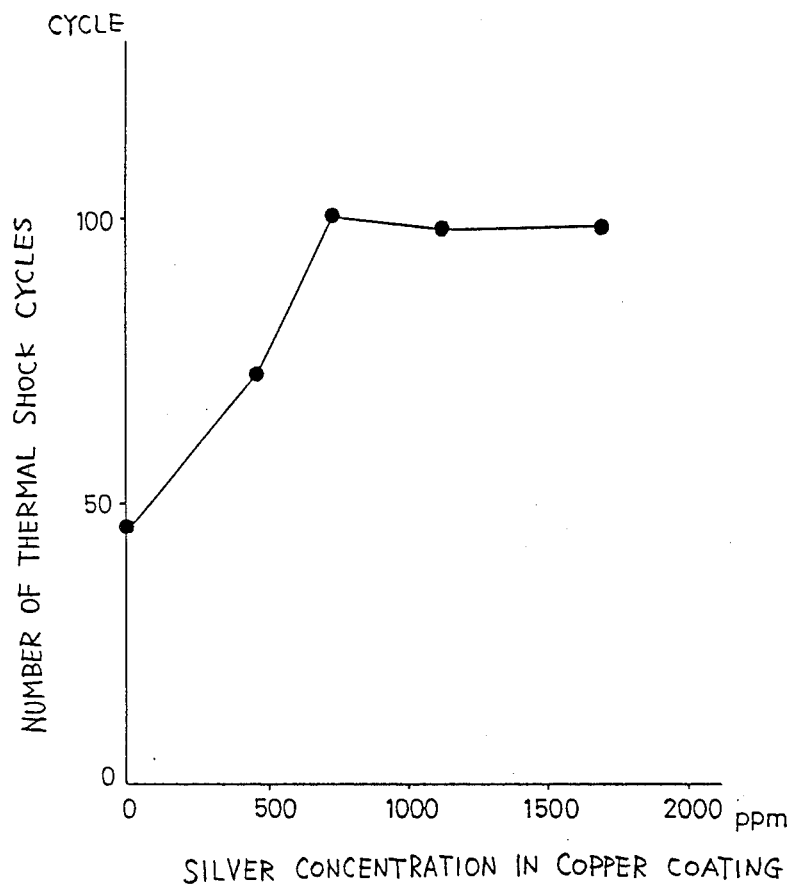
FIG. 6 is a graph indicating a relation between the silver concentration and the thermal shock resistance of the instant copper coating.

FIG. 6 indicates that the resistance to a thermal shock of the copper coating increases with an increasing average concentration of silver of the coating. The thermal shock resistance of the coating containing about 750 ppm is more than two times as high as that of the coating which does not contain silver. In this connection, it is noted that an increase in the silver content of the plating bath does not necessarily result in an increase in the concentration of silver in the copper coating obtained, since increasing the silver content of the bath will change the other plating conditions in most cases.

Example 5

Copper coatings having different numbers of the silver-rich layers 10 were prepared in the same plating conditions as used in Example 1, with the exception of changing the number of cycles for adding the sodium iodide and chelate compound of Ag and EDTA. The mechanical properties of the obtained coatings were measured. The measurements revealed that where the thickness of the coating is 20 microns, the most excellent properties were obtained on the coatings which have four or five silver-rich layers 10.

While the present invention has been described in its preferred embodiments with a certain degree of particularity, it is to be understood that the invention is not limited to the details or the illustrated examples, and that various changes and modifications may be made in the invention, in the light of the foregoing teaches, without departing from the spirit and scope of the invention defined in the following claims.

What is claimed is:

1. A process of forming on a substrate a copper coating which has excellent mechanical properties, comprising the steps of depositing copper on said substrate by chemical plating in a deposition bath by intermittently adding sodium iodide and a chelate compound of silver and ethylenediaminetetraacetic acid to said deposition bath, thereby forming at least one silver-rich layer during the deposition of copper.

2. A process according to claim 1, wherein said step of forming at least one silver-rich layer comprises forming a plurality of silver-rich layers.

3. A process according to claim 1, wherein said steps of depositing copper and forming at least one silver-rich layer comprise:

intermittently adding 0.001–10 g of sodium iodide and 0.001–10 g of a chelate compound of silver and ethylenediaminetetraacetic acid (Ag.EDTA), to a plating bath which contains 1–50 g of cupric sulfate pentahydrate ($CuSO_4.5H_2O$), 5–200 g of ethylenediaminetetraacetic acid tetrasodium salt dihydrate ($EDTA.4Na.2H_2O$), 1–30 ml of formalin (solution of about 37 wt. % of HCHO in water), 1–100 mg of $\alpha,\alpha'$-dipyridyl, and 1–100 g of polyethylene glycol, each per 1 l of water;

maintaining a temperature of said bath within a range between 60° C. and 85° C., a pH value of said bath within a range between 11.0 and 13.0, and a specific gravity of said bath within a range between 1 and 18 in Baumé scale; and continuously stirring said bath by blowing air into the bath, whereby the deposition of copper and silver occurs at a rate of 1–5$\mu$/hour.

4. A process according to claim 3, wherein said step of intermittently adding said sodium iodie and said chelate compound of Ag and EDTA comprises at least one adding cycle each of which consists of a plurality of intermittent additions effected at an interval of a first time span to effect deposition of copper and silver to said substrate, and an interruption for a second time span following completion of said intermittent additions, said second time span being longer than said first time span.

5. A process of producing a printed-wiring board having an electrically insulating substrate, and a conductor pattern formed on said substrate, said conductor pattern consisting of a copper coating which is formed by depositing copper on selected areas of said substrate by chemical plating in a deposition bath such that said selected areas define said conductor pattern, said process comprising the step of forming at least one silver-rich layer during the deposition of copper by intermittently adding sodium iodide and a chelate compound of silver and ethylenediaminetetraacetic acid to said deposition bath.

6. A process according to claim 5, further comprising forming at least one through-hole through a thickness of said substrate, and forming said copper coating on opposite major surfaces of said substrate, and an inner surface defining said at least one through-hole.

7. A process of producing a printed-wiring board having an electrically insulating substrate, and a conductor pattern on at least one of opposite major surfaces of said substrate, said process comprising:

forming a copper coating over an entire area of said at least one major surface, by depositing copper on said at least one surface by chemical plating in a deposition bath, said chemical plating performed by intermittently adding sodium iodide and a chelate compound of silver and ethylenediaminetetraacetic acid to said deposition bath;

forming at least one silver-rich layer during the deposition of copper; and removing selected portions of said copper coating so that unremoved portions of the copper coating define said conductor pattern.

8. A printed-wiring board comprising an electrically insulating substrate, and at least one conductor pattern consisting of a copper coating which is formed by deposition of copper by chemical plating, said copper coating including at least one silver-rich layer, the concentration of silver being greatest closest to said substrate.

9. A printed-wiring board according to claim 8, wherein said copper coating includes a plurality of silver-rich layers.

10. A printed-wiring board according to claim 8, wherein said electrically insulating substrate has at least one through-hole formed through a thickness thereof, said copper coating being formed on opposite major surfaces of said substrate and on an inner surface defining said at least one through-hole, the copper coating formed on said inner surface connecting the conductor patterns formed on said opposite major surfaces.

11. A printed-wiring board according to claim 8, wherein an average content of the silver in said copper coating is 500 ppm or higher.

12. A printed-wiring board according to claim 8, wherein said electrically insulating substrate comprises a paper impregnated with an epoxy resin.

13. A printed-wiring board according to claim 8, wherein said electrically insulating substrate comprises a paper impregnated with a phenol resin.

14. A process of forming on a substrate a copper coating which has excellent mechanical properties, comprising the steps of depositing copper on said substrate by chemical plating in a deposition bath by adding a reducible silver compound and a reducing agent to said bath, thereby forming at least one silver-rich layer during the deposition of copper.

15. A process of forming on a substrate a copper coating which has excellent mechanical properties, comprising the steps of depositing copper on said substrate by chemical plating in a deposition bath by adding a reducible silver compound and a reducing agent to said bath, thereby forming at least one silver-rich layer during the deposition of copper, the concentration of silver being greatest closest to said substrate.

* * * * *